United States Patent
Dong et al.

(10) Patent No.: US 9,459,177 B1
(45) Date of Patent: Oct. 4, 2016

(54) WAFER-LEVEL TESTING OF OPTICAL CIRCUIT DEVICES

(71) Applicant: Alcatel-Lucent USA Inc., Murray Hill, NJ (US)

(72) Inventors: Po Dong, Murray Hill, NJ (US); Young-Kai Chen, Murray Hill, NJ (US)

(73) Assignee: Alcatel Lucent, Boulogne, Billancourt (FR)

( * ) Notice: Subject to any disclaimer, the term of this patent is extended or adjusted under 35 U.S.C. 154(b) by 0 days.

(21) Appl. No.: 14/713,560

(22) Filed: May 15, 2015

(51) Int. Cl.
| | |
|---|---|
| *G01N 21/00* | (2006.01) |
| *G01M 11/00* | (2006.01) |
| *H01L 21/66* | (2006.01) |
| *G01R 31/3187* | (2006.01) |
| *G01R 31/28* | (2006.01) |
| *H01L 33/00* | (2010.01) |
| *G02B 6/122* | (2006.01) |

(52) U.S. Cl.
CPC ............ *G01M 11/30* (2013.01); *G01R 31/282* (2013.01); *G01R 31/3187* (2013.01); *G02B 6/122* (2013.01); *H01L 22/30* (2013.01); *H01L 33/005* (2013.01)

(58) Field of Classification Search
CPC combination set(s) only.
See application file for complete search history.

(56) References Cited

U.S. PATENT DOCUMENTS 6,163,631 A * 12/2000 Kawanishi ......... G02B 6/12004
372/50.1

* cited by examiner

*Primary Examiner* — Tri T Ton
(74) *Attorney, Agent, or Firm* — Parker Justiss, PC

(57) ABSTRACT

An apparatus comprising a wafer substrate having a planar optical layer thereon and a plurality of adjacent pairs of sacrificial optical testing parts and optical circuit parts located on the optical layer. The sacrificial testing part includes a vertical optical coupler that is oriented to redirect a test light signal between a direction substantially non-parallel to the planar optical layer and a direction that is substantially parallel to the planar optical layer. The optical circuit part includes an optical edge coupling port oriented to permit transfer of the test light signal through the optical edge coupling port and between the sacrificial testing part and the optical circuit part. The apparatus also comprises a trench located in the planar optical layer, the trench separating the sacrificial testing part from the optical circuit part for each of the plurality of adjacent pairs such that the test light signal passes across the trench between the sacrificial testing part and the optical circuit part.

25 Claims, 11 Drawing Sheets

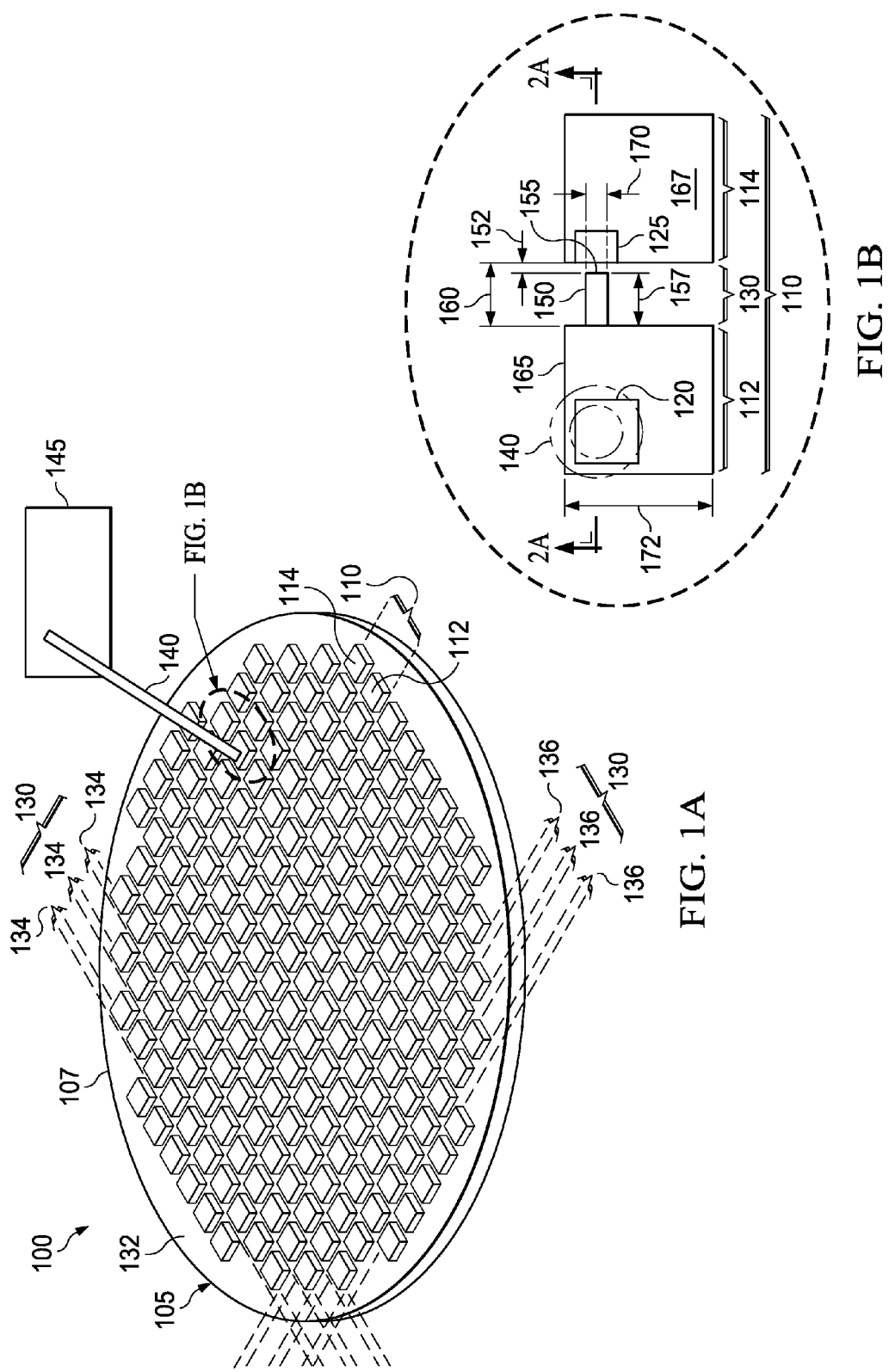

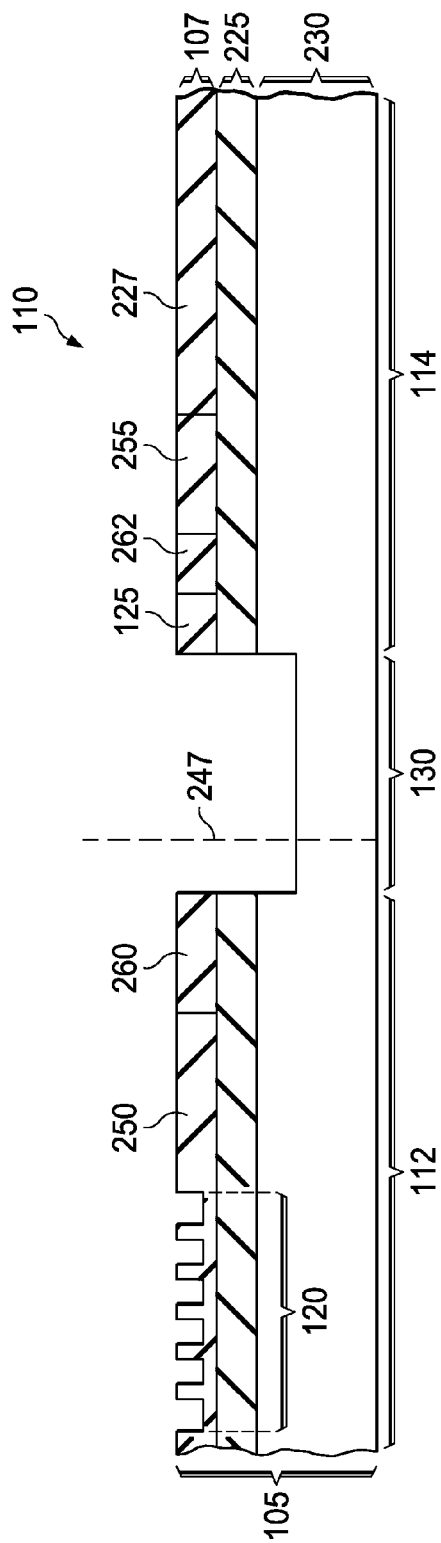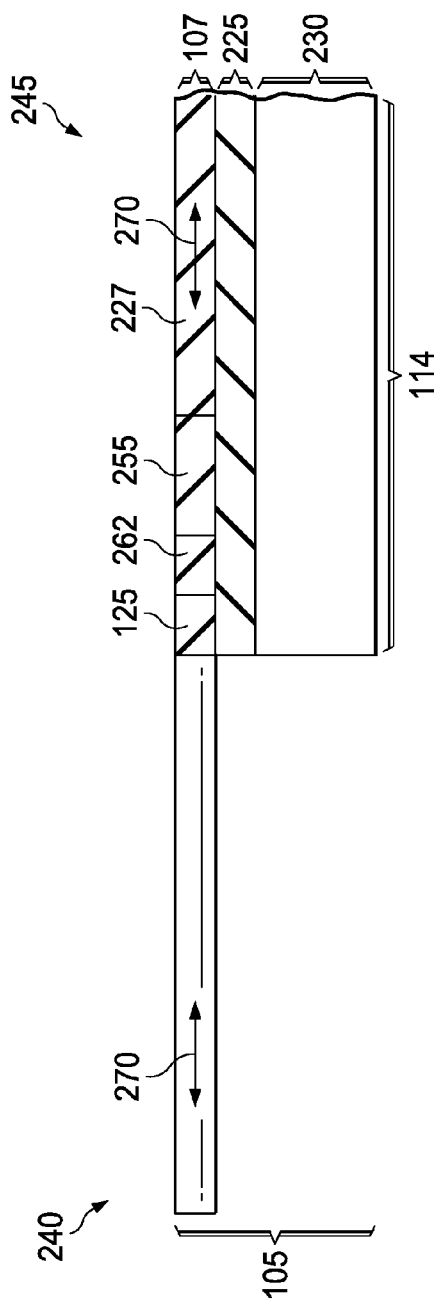

WAFER-LEVEL TESTING OF OPTICAL CIRCUIT DEVICES

TECHNICAL FIELD

The invention relates, in general, to optical devices including an apparatus and methods for wafer level testing optical devices, and to methods of manufacturing the apparatus.

BACKGROUND

This section introduces aspects that may help facilitate a better understanding of the inventions. Accordingly, the statements of this section are to be read in this light and are not to be understood as admissions about what is prior art or what is not prior art.

Optical circuit devices, such as photonic integrated circuits (PICs) and other optical circuits, are crucial to realize small-form factor, low-power consumption, and low cost optical modules for communications. Often the fabrication of optical modules includes: fabrication of optical circuit devices on a wafer, dicing or cleaving the wafer into individual chips each having the optical circuit device, testing the optical circuit devices for functionality, screening out the chips having non-functional devices and packaging the remaining chips having function devices. Testing is a significant fabrication cost especially when performed by a human operator one chip at a time.

SUMMARY

One embodiment is an apparatus. The apparatus comprises a wafer substrate having a planar optical layer thereon and a plurality of adjacent pairs of sacrificial optical testing parts and optical circuit parts located on the optical layer. The sacrificial testing part includes a vertical optical coupler that is oriented to redirect a test light signal between a direction substantially non-parallel to the planar optical layer and a direction that is substantially parallel to the planar optical layer. The optical circuit part includes an optical edge coupling port oriented to permit transfer of the test light signal through the optical edge coupling port and between the sacrificial testing part and the optical circuit part. The apparatus also comprises a trench located in the planar optical layer, the trench separating the sacrificial testing part from the optical circuit part for each of the plurality of adjacent pairs such that the test light signal passes across the trench between the sacrificial testing part and the optical circuit part.

In any such embodiments, the vertical optical couplers can include a mirror or a grating. In some embodiments, the vertical optical coupler can receive the test light signal transmitted from an optical testing fiber located above the planar optical layer, and the test light signal is redirected from the vertical optical coupler to a waveguide of the sacrificial part, across the trench and to the optical edge coupling port of the circuit part. In some embodiments, the optical circuit part can include a laser configured to emit the test light signal to a waveguide of the optical circuit part, wherein the test light signal passes through the optical edge coupling port, across the trench to an optical waveguide of the sacrificial part to the vertical optical coupler and is redirected to an optical test fiber located above the planar optical layer to receive the test light signal.

In any such embodiments, an extension portion of the sacrificial part can extend part way across the trench towards the optical edge coupler, wherein a gap distance between an end of the extension portion and the optical edge coupler is at least about 50 percent less than a remaining portion of trench width that does not include the extension portion. In any such embodiments, the sacrificial testing part can includes an optical mode converter through which the test light signal passes through before passing across the trench to the optical circuit part. In any such embodiments, the optical circuit part can include an optical mode converter through which the test light signal passes before passing to circuit elements of the optical circuit part. In any such embodiments, the optical edge coupling port of the optical circuit part can be configured as one of an input port or an output port. In any such embodiments, the sacrificial testing part can include a photo detector that receives a tapped portion of the test light signal that is not received by the optical circuit part.

In any such embodiments, the sacrificial testing part can include a power splitter, a polarization rotator, polarization combiner, and an optical mode converter. The power splitter can be configured to receive the redirected test light signal from the vertical optical coupler and send a first portion of the test light signal to the polarization rotator and a second portion of the redirected test light signal to the polarization combiner. The polarization rotator can be configured to rotate the polarization of the first portion of the test light signal and send a polarization-rotated form of the first portion of the test light signal to the polarization combiner.

In any such embodiments, the sacrificial testing part can include a first photo detector that receives a tapped portion of the first polarization-rotated form of first portion of the test light signal that is not received by the polarization combiner, and, a second photo detector that receives a tapped portion of the second portion of the test light signal that is not received by the polarization combiner.

Another embodiment is a method that comprises wafer-level testing each one of a plurality of adjacent pairs of sacrificial optical testing parts and the optical circuit parts located on the planar optical layer of a wafer substrate. Testing can include directing a test light signal through a vertical optical coupler of one of the sacrificial optical parts, the vertical optical coupler being oriented to redirect the test light signal between a direction substantially non-parallel to the planar optical layer and a direction that is substantially parallel to the planar optical layer. Testing can include directing the test light signal traveling in the direction substantially parallel to the planar optical layer through an optical edge coupling port of the optical circuit part, the optical circuit part oriented to transfer of the test light signal between the sacrificial testing part and the optical circuit part. The test light signal travels in the direction substantially parallel to the planar optical layer passes a across a trench located in the planar optical layer, the trench separating the sacrificial testing part from the optical circuit part for each of the plurality of adjacent pairs.

In any such embodiments, the test light signal can be transmitted to or from an end of an optical fiber probe located over the planar optical layer and the optical fiber probe is configured to be automatically and successively aligned with the vertical optical coupler of each one of the sacrificial parts. Any such embodiments can include monitoring the redirected test light signal by passing a tapped portion of the redirected test light signal to a photo detector of the sacrificial testing part.

Another embodiment is a method that comprises manufacturing an apparatus. The method of manufacture includes providing a wafer substrate having a planar optical layer thereon and forming a plurality of adjacent pairs of sacrificial optical testing parts and optical circuit parts on the planar optical layer. Forming the adjacent pairs can include forming a vertical optical coupler of each of the sacrificial testing parts, the vertical optical coupler oriented to redirect a test light signal between a direction substantially non-parallel to the planar optical layer and a direction that is parallel to the planar optical layer. Forming the adjacent pairs can include forming an optical edge coupling port on each of optical circuits, the optical edge coupling port oriented to permit transfer of the test light signal through the optical edge coupling port and between the sacrificial testing part and the optical circuit part. The method of manufacture includes forming a trench in the wafer substrate, the trench separating the sacrificial testing part from the optical circuit part for each of the plurality of adjacent pairs such that the test light signal passes across the trench between the sacrificial testing and the optical circuit part.

In any such embodiments, forming a vertical optical coupler can include patterning the planar optical layer to form an opting grating or a turning mirror in the planar optical layer. In any such embodiments, forming the trench can include patterning the planar optical layer to form an extension portion of the sacrificial part that partially extends across the trench towards the optical edge coupler, wherein a gap distance between an end of the extension portion and the optical edge coupler is at least about 50 percent less than a remaining portion of trench width that does not include the extension portion. Any such embodiments can further include forming a photo detector on each of the sacrificial testing parts, the photo detector configured to receive a tapped portion of the test light signal that is not received by the optical circuit part. Any such embodiments can further include positioning one or more optical fiber probes over one or more of the optical vertical couplers of the planar optical layer and providing an alignment module programmed to automatically shift the one or more optical fiber probe over the planar optical layer.

BRIEF DESCRIPTION OF THE DRAWINGS

The embodiments of the disclosure are best understood from the following detailed description, when read with the accompanying FIGUREs. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which:

FIG. 1A presents a perspective view of an example apparatus of the present disclosure;

FIG. 1B presents a plan view of a portion of the apparatus depicted in FIG. 1A;

FIG. 2B presents a cross-sectional view of the portion of the apparatus depicted in FIG. 1B prior to a dicing procedure to separate a sacrificial part and optical circuit part of the wafer;

FIG. 2C presents a cross-sectional view of the diced optical circuit part of the wafer depicted in FIG. 2B after edge-coupling an optical fiber to the optical circuit part;

In the Figures and text, similar or like reference symbols indicate elements with similar or the same functions and/or structures.

Figure 2A:
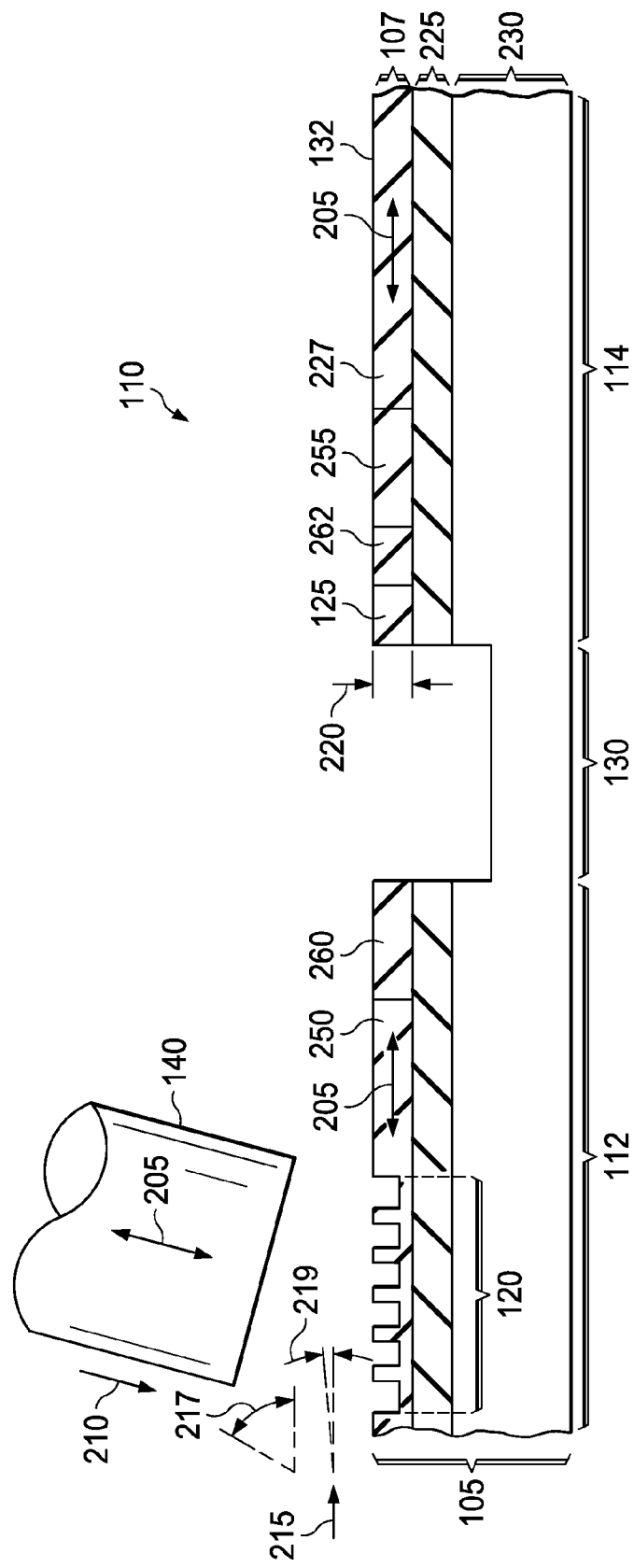
FIG. 2A presents a cross-sectional view of the portion of the apparatus depicted in FIG. 1B along view line 2A-2A, during passage of a test signal light through a sacrificial testing part and an optical circuit part of the substrate wafer such as during wafer level testing.

In the Figures, the relative dimensions of some features may be exaggerated to more clearly illustrate one or more of the structures or features therein.

Herein, various embodiments are described more fully by the Figures and the Detailed Description. Nevertheless, the inventions may be embodied in various forms and are not limited to the embodiments described in the Figures and Detailed Description of Illustrative Embodiments.

DETAILED DESCRIPTION

The description and drawings merely illustrate the principles of the inventions. It will thus be appreciated that those skilled in the art will be able to devise various arrangements that, although not explicitly described or shown herein, embody the principles of the inventions and are included within its scope. Furthermore, all examples recited herein are principally intended expressly to be for pedagogical purposes to aid the reader in understanding the principles of the inventions and concepts contributed by the inventor(s) to furthering the art, and are to be construed as being without limitation to such specifically recited examples and conditions. Moreover, all statements herein reciting principles, aspects, and embodiments of the inventions, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

The cost of testing can be reduced by performing wafer-level testing, which can be automatically done from chip-to-chip on the wafer without human intervention. Conventional wafer level testing requires the presence of a vertical coupling element in the optical device being tested so that a test light from above the wafer can be coupled into the optical device. Many optical devices, such edge or butt-coupled devices, however, do not have a vertical coupling element, thereby eliminating the possibility of performing wafer level testing. Rather, the testing of such edge-coupled circuit is typically done using an edge-coupled test light after dicing and separating the individual chips.

It was discovered that wafer level testing can be performed even on edge-coupled optical devices by providing a vertical optical coupler on sacrificial parts of the wafer. Each sacrificial part is paired with an optical circuit part but separated from the optical circuit part by a trench. The trench facilitates separation of sacrificial parts from the optical circuit parts as part of a dicing procedure. The sacrificial parts are used only for wafer-level testing of the optical circuit part, and during or after dicing, the sacrificial parts are destroyed or disposed of and are not part of the final diced optical circuit.

Surprisingly, cost-efficient testing can be still performed on such edge-coupled optical circuits at the wafer levels, even though substantial portions of the wafer surface (e.g., in some cases up to about 25 to 50 percent of the wafer surface) can be occupied by sacrificial parts which are eventually not used in the final optical circuit. However, it was discovered that the costs of forming complex sacrificial testing structures are outweighed by the cost saving benefits of being able to perform automated testing of the optical circuits at the wafer level.

One embodiment is an apparatus, such as a testing apparatus. FIG. 1A presents a perspective view of an example embodiment apparatus 100 of the present disclosure and FIG. 1B presents a plan view of a portion of the apparatus depicted in FIG. 1A. FIG. 2A presents a cross-sectional view of the portion of the apparatus 100 depicted in FIG. 1B, FIG. 1B along view line 2A-2A, during passage of a test signal light through a sacrificial testing part and an optical circuit part of the substrate wafer such as during wafer level testing. FIG. 2B presents a cross-sectional view of the portion of the apparatus 100 depicted in FIG. 1B prior to a dicing procedure to separate a sacrificial part and optical circuit part of the wafer. FIG. 2C presents a cross-sectional view of the diced optical circuit part of the wafer depicted in FIG. 2B after edge-coupling an optical fiber to the optical circuit part.

With continuing reference to FIGS. 1A-2C, the apparatus 100 comprises a wafer substrate 105 having a planar optical layer 107 thereon. The apparatus 100 also comprises a plurality of adjacent pairs 110 of sacrificial optical testing parts 112 and optical circuit parts 114 located on the optical layer 107. The sacrificial testing part 112 includes a vertical optical coupler 120 that is oriented to redirect a test light signal 205 between a direction 210 substantially non-parallel to the planar optical layer 107 and a direction 215 that is substantially parallel (e.g., 0±5 degrees) to the planar optical layer 107.

As defined herein, the direction 210 is substantially non-parallel to the planar optical layer 107 when the direction 210 of the test light forms an acute angle 217 in a range of about 5 to about 90 degrees with respect to the surface 132 of the planar optical layer 107. For example, in some embodiments, to facilitate precise application of the test light signal 205 the direction 210 can be substantially perpendicular to the planar optical layer 107 is (e.g., 90±10 degrees and in some embodiments about 85±5 degrees, to reduce back-reflection of the test light signal 205 into the optical testing fiber 140 located above the surface 132). As defined herein the direction 215 is substantially parallel to the planar optical layer 107 when the direction 215 of the test light forms an acute angle 219 in a range of about 0 to about 5 with respect to the surface 132 of the planar optical layer 107. In some such embodiments, the direction 215 can be substantial co-planar with the planar optical layer 107. In some embodiments such as depicted in s depicted in FIGS. 1A-2A, the test light signal's 205 non-parallel direction 210 comes from above the planar optical layer 107. However, in other embodiments, the test light signal 205 non-parallel direction 210 could come from below the planar optical layer 107. For instance, the test light signal 205 could travel from a non-parallel direction 210 as emitted from an optical testing fiber 140 located below the substrate 105 and the test light signal 205 could pass in the non-parallel direction 210 through underlying layers, 225, 230 to the vertical optical coupler 120 the planar optical layer 107.

The optical circuit part 112 includes an optical edge coupling port 125 oriented to permit transfer of the test light signal 205 through the optical edge coupling port 125 and between the sacrificial testing part 112 and the optical circuit part 114. The apparatus 100 also comprises a trench 130 located in the planar optical layer 107, the trench 130 separating the sacrificial testing part 112 from the optical circuit part 114 for each of the plurality of adjacent pairs 110 such that the test light signal 205 passes across the trench 130 between the sacrificial testing part 112 and the optical circuit part 114.

As illustrated in FIG. 1A, in some embodiments, the plurality of adjacent pairs 110 of sacrificial optical testing parts 112 and optical circuit parts 114 can be distributed over the entire surface 132 of the wafer substrate 105 and each of the pairs 110 of sacrificial optical testing parts 112 and optical circuit parts 114 are separated from each other and from other pairs 110 by the trench 130. As illustrated in FIG. 1A, some embodiments of the trench 130 can include rows 134 and columns 136 of trenches that interconnect and extend across the entire surface 132 of the wafer substrate 105. In some embodiments, such as depicted in FIG. 1A the sacrificial optical testing parts 112 and optical circuit parts 114 can be substantial the same size. For instance, each of the parts 112, 114 can occupy substantially the same cross-sectional area of the planar surface 132 within about 10 percent. In other embodiments, however, the sacrificial optical testing parts 112 and the optical circuit parts 114 can be substantially different in size. For instance, in some embodiments, to increase the yield of the optical circuit per wafer substrate, each of the sacrificial optical testing parts 112 can occupy about 50 percent or less, or about 10 percent or less, or about 1 percent or less, than the cross-sectional area as the corresponding optical circuit part 114 of the adjacent pair 110.

As illustrated in FIG. 2A, the trench 130 extends at least through a thickness 220 of optical layer 107, and in some embodiments, all or a portion the thickness of underlying layers, 225, 230. For instance, in some embodiments the substrate wafer 105 includes a silicon optical layer 107 (e.g., an epitaxial silicon layer) located on an underlying silicon oxide layer 225 (e.g., an optical cladding layer) and silicon or other material handle layer 230. As further illustrated in FIG. 2A, the trench 130 can extend through the optical layer 107, the silicon oxide layer 225 and a portion of the handle layer 230.

The optical edge coupling port 125 of the optical circuit part 114 provides a mechanical structure to facilitate edge or butt optical coupling of an optical fiber (e.g., fiber 240, FIG. 2C) of the final optical circuit (e.g., circuit 245, FIG. 2C) after the wafer substrate 105 is diced (e.g., along a dicing line 247, FIG. 2B) through the trench 130 and the optical circuit part 114 is separated from the sacrificial testing part 112.

In addition to the optical edge coupling port 125, the optical circuit part 114 can include one or more optical components 227 (FIG. 2A) that are used in the construction of photonic integrated circuits or other optical circuits, such as used in the optical telecommunication and computing industries. Non-limiting examples of such optical components includes: arrayed waveguide grating (AWG), optical power splitters, optical modulators, photo detectors, optical couplers, optical polarization rotator, lasers or in-circuit controllers of any of these optical components. In some embodiments, the optical layer 107 can be located within the component, e.g., any of high speed modulators, resonators, filters, polarization rotators, polarization beam splitters, variable optical attenuators. For example, the optical layer 107 can form part of an AWG component 227 of a photonic integrated circuit or be part of a laser component 227 such as a laser diode for a photonic integrated circuit.

The apparatus 100 is advantageous for the wafer level testing of edge-coupled optical circuits that do not have vertical optical coupling components. In such embodiments of the apparatus 100, the optical circuit parts 114 of the substrate wafer 105 are free of vertical optical couplers. However, in other embodiments, the apparatus 100 can still be advantageous for testing components 227 of edge-coupled optical circuit parts 114 even when having a vertical optical coupler. For instance, the ability to redirect the test light signal 205 along the substantially parallel and through the optical edge coupling port 125 can provide an efficient way to wafer level test the functionality of optical edge coupling port 125 itself as well as a waveguide 255 in the optical layer 107 connected to the port 125 and other optical components that are connected to the port 125 and the waveguide 255. In some embodiments, some optical components 227 may not otherwise be testable at the wafer level. For instance, some optical components may not be accessible for testing by passing a test light signal through a vertical coupler of the optical circuit part 114.

In some embodiments of the apparatus 100, such as illustrated in FIG. 2A-2B the vertical optical coupler 120 can include a grating, while in other embodiments, the vertical optical coupler 120 can include a turning mirror. The vertical optical coupler 120 configured as a grating, can be one-dimensional or two-dimensional grating etched into the planar optical layer 107. When the vertical optical coupler 120 is a two-dimensional grating the vertical optical coupler can redirect the test light signal 205 between the substantially non-parallel direction 210 and two different directions (e.g., direction 215 and another direction in or out of the page) substantially parallel to the planar optical layer 107 and across the trench 130 to two different optical edge coupling ports 125 of two different optical circuit parts 114.

As illustrated in FIG. 1A, some embodiments of apparatus 100 further include an optical testing fiber 140 and an alignment module 145 programmed to automatically shift the optical testing fiber 140 over the surface 130 planar optical layer 107 as part of a testing procedure.

In some embodiments, the test light signal 205 is sent from the optical testing fiber 140 to the optical circuit part 114. For instance, the vertical optical coupler 120 receives the test light signal 205 transmitted from the optical test fiber 140 located above the planar optical layer 107, and the test light signal 205 is redirected from the vertical optical coupler 120 to a waveguide 250 (FIG. 2A) of the sacrificial part 112, across the trench 130 to the optical edge coupling port 125 of the optical circuit part 114.

In other embodiments, the test light signal 205 can originate from the optical circuit part 114 itself. For instance, the optical circuit part 114 can include a laser component 227 configured to emit the test light signal 205 to a waveguide 255 (FIG. 2A) of the optical circuit part 114. The test light signal 205 passes through the optical edge coupling port 125, across the trench 130 to an optical waveguide 250 of the sacrificial part 112 to the vertical optical coupler 120 and is redirected to the optical test fiber 140 located above the planar optical layer and oriented to receive the test light signal 205.

As illustrated in FIG. 1B, some embodiments of the apparatus 100 further include an extension portion 150 of the sacrificial part 112 which extends part way across the trench 130 towards the optical edge coupler. For instance in some embodiments a gap distance 152 between an end 155 of the extension portion 150 and the optical edge coupler 125 is at least about 50 percent less than a remaining portion 157 of trench width 160 that does not include the extension portion 150. Providing a gap distance 152 that is substantially less than the trench width 160 can facilitate minimizing a decrease in the mode size of the test light signal 205 as it travels across the trench 130.

For instance, in some embodiments, to facilitate efficient dicing, the width 160 between the facing sides 165, 167 of the adjacent pairs 110 of the sacrificial testing part 112 that do not include the extension portion 150, and, the optical circuit part 114 is about 50 microns or about 5 microns or in a range from about 50 micron to 5 microns. In such embodiments, the mode size of the test light signal 205 traveling across the trench 130 can decrease such that there is poor optical coupling efficiency of the test light signal 205 to the optical circuit part 114. Further decreasing the trench width 160 could improve optical coupling efficiency, but, at the same time increase the risk of damaging the optical circuit part 114 during dicing.

Providing the extension portion 150 and the small gap width 162 as a small portion of the trench 130 between the adjacent pairs 110 facilitates having acceptable optical coupling efficiency while mitigating the risk of damaging the optical circuit part 114 during dicing.

For instance, in some embodiments, the gap width 152 is less than about 5 microns or less than about 2 microns or in a range of about 1.5 microns to 0.5 microns. For instance, in some embodiments, a width 170 of the extension portion is about 10 percent or less, or about 1 percent or less than a length 172 of the side 165 of the sacrificial test part 112 facing the side 167 of the optical circuit part 114.

As illustrated in FIG. 2A, in some embodiments, the sacrificial testing part 112 further includes an optical mode converter 260 through which the test light signal 205 passes through before passing across the trench 130 (or gap width 152) to the optical circuit part 114. For instance, in some embodiments, the optical mode converter 260 can increase the mode size of test light signal 205 passing from the sacrificial testing part 112 to the optical circuit part 114, and thereby beneficially increase optical coupling efficiency, such as when distance traveled across trench 130 or the gap width 152 is more than about 2 microns. For instance, in some embodiments, the optical mode converter 260 can be configured to convert the mode size of the test light signal 205 from a submicron size to a size of at least about 1 microns or about 2 microns.

As illustrated in FIG. 2A, in some embodiments, the optical circuit part 114 includes an optical mode converter 262 through which the test light signal 205 passes through before passing to other circuit components 227 of the optical circuit part 114, or, passing to the sacrificial testing part 112. For instance, in some embodiments the circuit optical mode converter 262 can be configured to receive the test light signal 205 from, or pass the test light signal 205 to, the optical edge coupling port 125. For instance, to facilitate optical coupling efficiency, the optical mode converter 262 of the optical circuit part 114 can match the mode of the optical mode converter 260 of the sacrificial testing part 112. Additionally, the optical mode converter 262 from the optically circuit part 114 can facilitate efficient optical coupling between the diced optical circuit 245 and an optical fiber 240 (e.g., horizontally oriented fiber carrying an optical telecommunication data 270) that is edge or butt coupled to the optical edge coupling port 125 (FIG. 2C).

Figure 3:
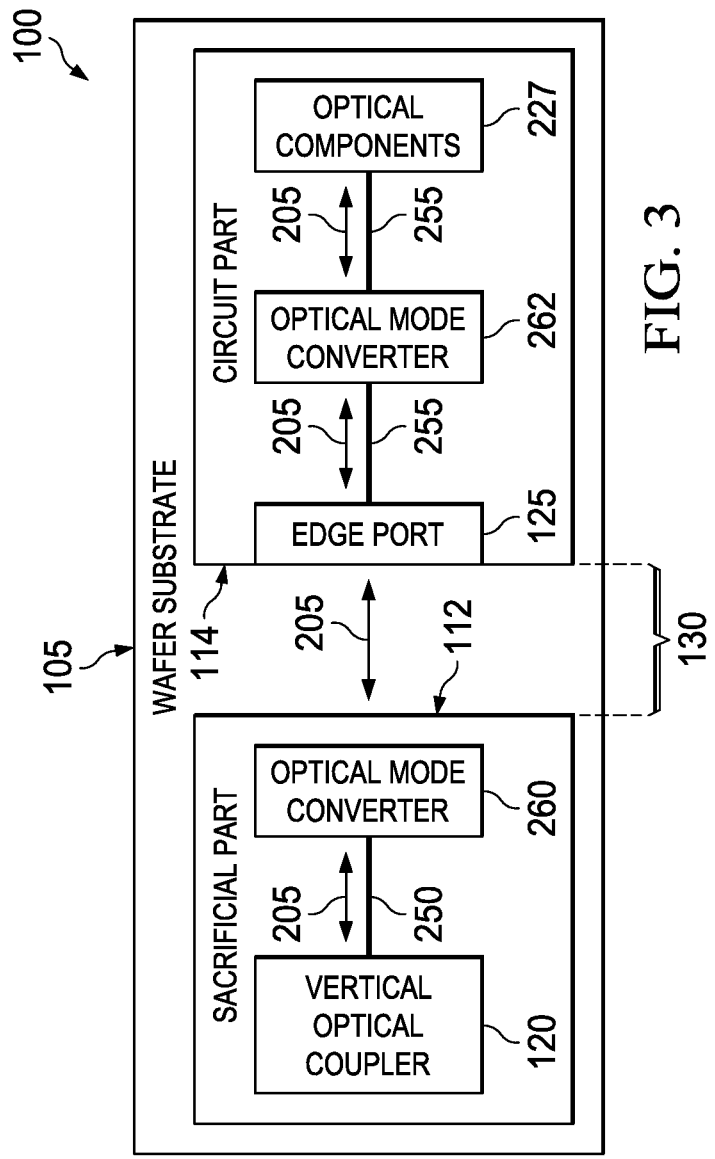
FIG. 3 presents a block diagram of a portion of an example apparatus similar to the portion depicted in FIG. 1B.

Aspects of various other embodiments of the apparatus 100 are illustrated in FIGS. 3-8, which present block diagrams of a portion of an example apparatus similar to the portion depicted in FIG. 1B. For instance, FIG. 3 presents a block diagram of a portion of an example apparatus 100 similar to the portion depicted in FIGS. 1B and 2A where one of adjacent pairs 110 of sacrificial testing parts 112 and optical circuit parts 114 of are depicted along with waveguides 250, 255 in the optical layer 107 to facilitate optical coupling between the components of these parts 112, 114.

In some such embodiments, the single optical edge coupling port 125 of the optical circuit part 114 is configured as one of an input port or an output port. For instance, in some embodiments, the port 125 is configured an input port when an incoming optical test signal 205 from a butt coupled fiber 240 is converted to an electrical signal, e.g., by an electro-optical converter component 227 of the optical circuit 245. For instance, in some embodiments, the port 125 is configured an output port when, an output test signal 205 is generated, e.g., by an optical laser component 227 of the optical circuit part 114.

Figure 4:
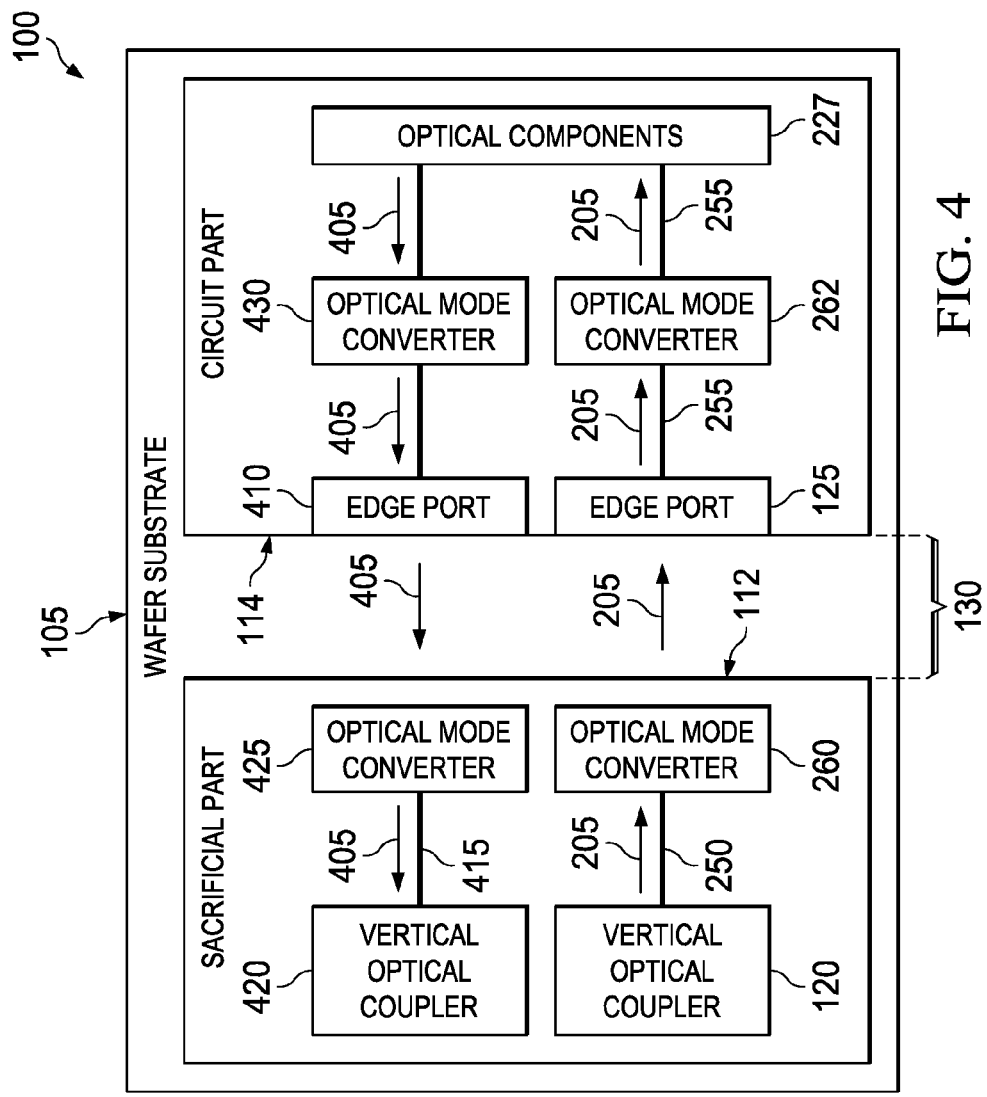
FIG. 4 presents a block diagram of a portion of an alternative example apparatus similar to that depicted in FIG. 3.

In some embodiments, such as illustrated in FIG. 4, the optical edge coupling port 125 is configured as an input port to receive an incoming optical signal 205 which is then is converted by the optical components 227 to an output optical test signal 405 which is directed out of optical circuit through a second optical edge coupling port 410 configured as an output port.

In some such embodiments, as illustrated in FIG. 4, the second optical edge coupling port 410 is on a same side 167 of the optical circuit part 114 as the first optical edge coupling port 125 and the output test light signal 405 travels across the same trench 130 to a second waveguide 415 of the sacrificial test part 112. In some such embodiments, the sacrificial testing part 112 can further include a second vertical optical coupler 420 to redirect the output optical test signal 405 to a second optical fiber located above the second vertical optical 420. In some such embodiments, to facilitate efficient optical coupling of the output test signal 405, the sacrificial testing part 112 can further include a second optical mode converter 425 and the optical circuit part 114 can further include a second optical mode converter 430.

Figure 5:
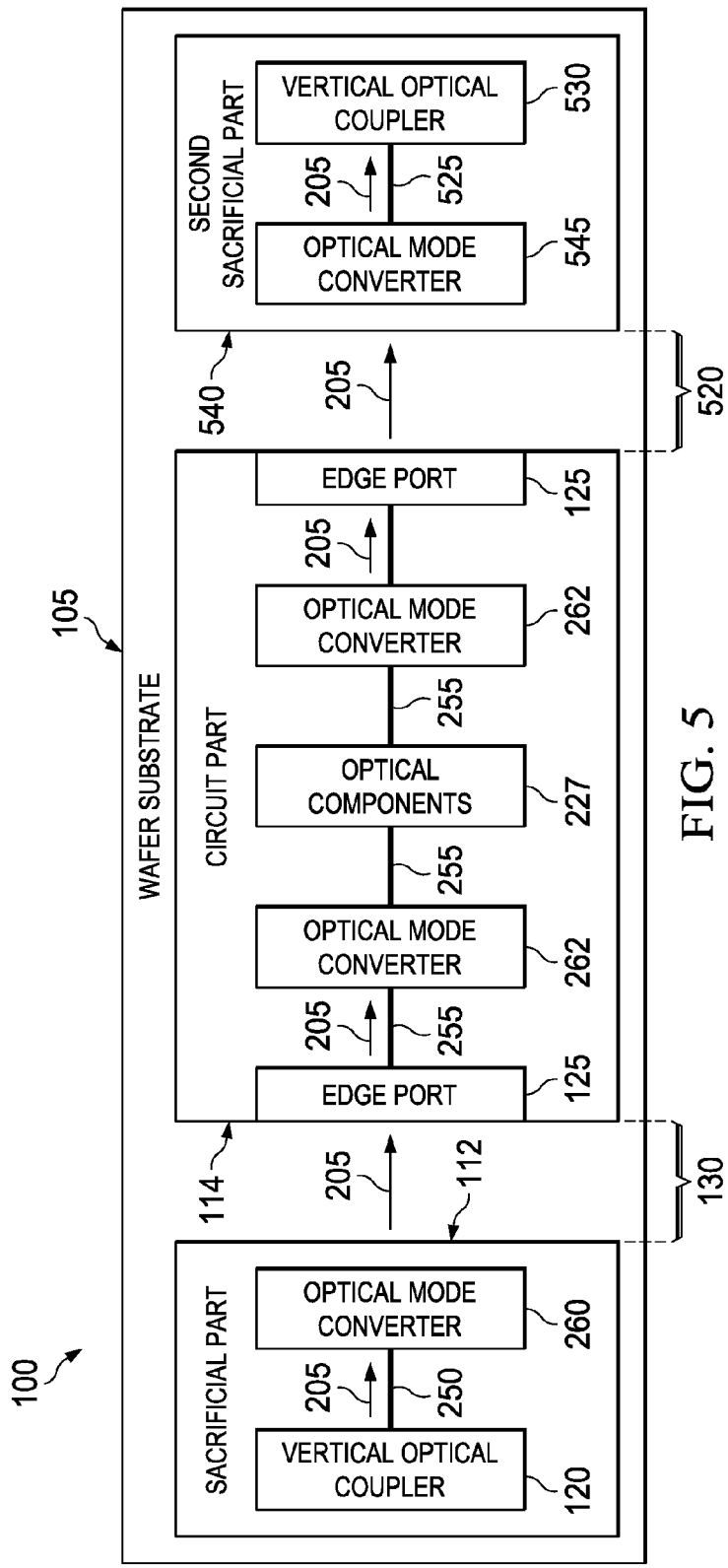
FIG. 5 presents a block diagram of a portion of an alternative example apparatus similar to that depicted in FIG. 3.

In other embodiments, such as illustrated in FIG. 5, the second optical edge coupling port 410 is located on a different side 510 of the optical circuit part 114 as the first optical edge coupling port 125 and the output test light signal 405 travels across a second different trench 520 to a waveguide 525 and a second vertical optical coupler 530 of a second sacrificial testing part 540 to be received by a second optical fiber located over the second vertical optical coupler 530. To facilitate efficient optical coupling of the output test signal 405, the second sacrificial testing part 540 can further include a second optical mode converter 545.

Figure 6:
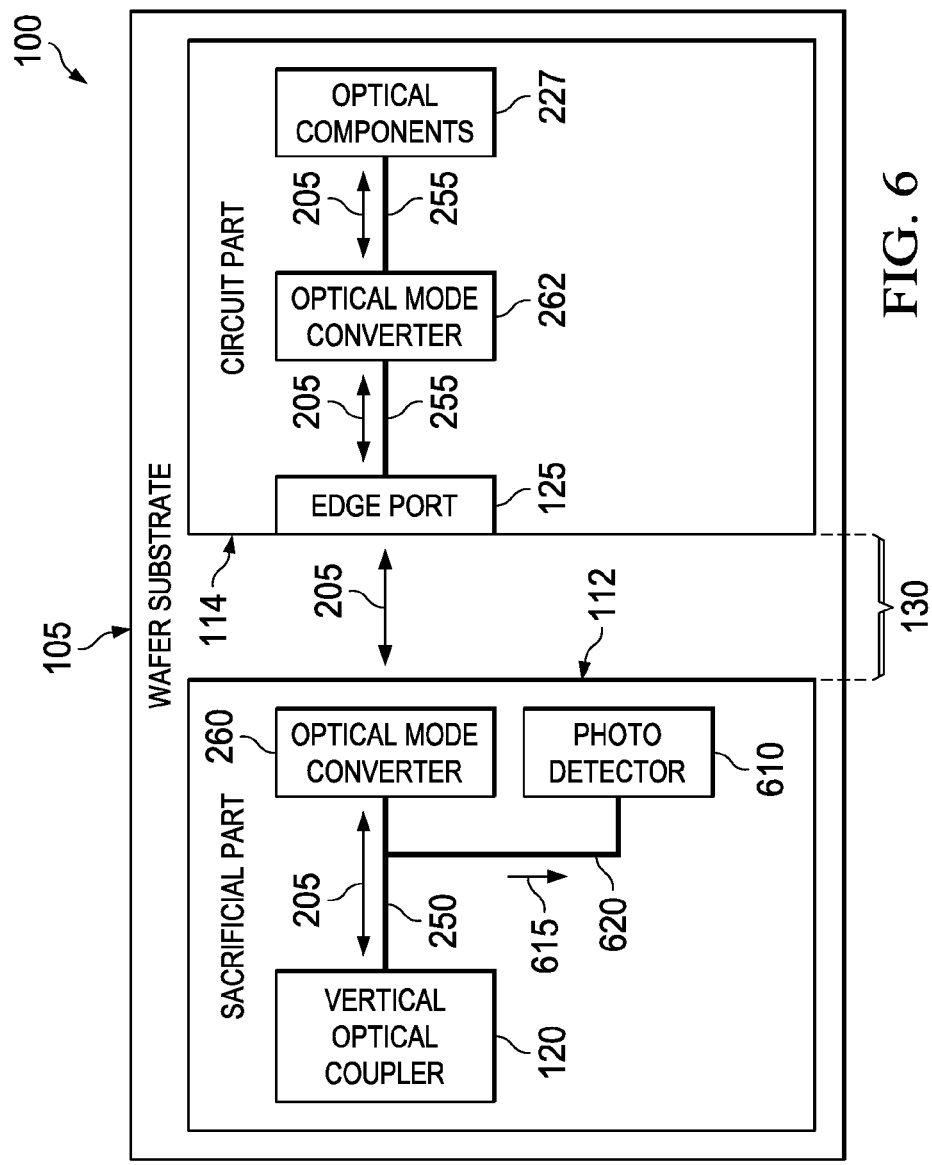
FIG. 6 presents a block diagram of a portion of an alternative example apparatus similar to that depicted in FIG. 3.

As illustrated in FIG. 6, in some embodiments, the sacrificial testing part 112 includes a photo detector 610 that receives a tapped portion 615 of the test light signal 205 that, e.g., may not be received by the optical circuit part 114. For instance, in some embodiments, a tapping waveguide 620 of the sacrificial testing part 112 can be configured to send a fraction (e.g., less than about 1 percent, less that about 10 percent or from about 1 percent to 10 percent, in some embodiments) of the test light signal 205 transmitted from a test probe fiber 140 to the vertical coupler 120 or transmitted from the optical circuit part 114 to the sacrificial testing part 112. The photo detector 610 can be configured to measure the total optical power and/or optical spectrum of the test light signal 205 that is coupled into the sacrificial testing part 112. This information can be used as a reference to e.g., determine the insertion loss of the optical test signal 205 into or out of the optical circuit part 112. Such information can also be used to account for variations in optical coupling efficiency and normalize test results between different pairs 110 of the parts 112, 114.

Figure 7:
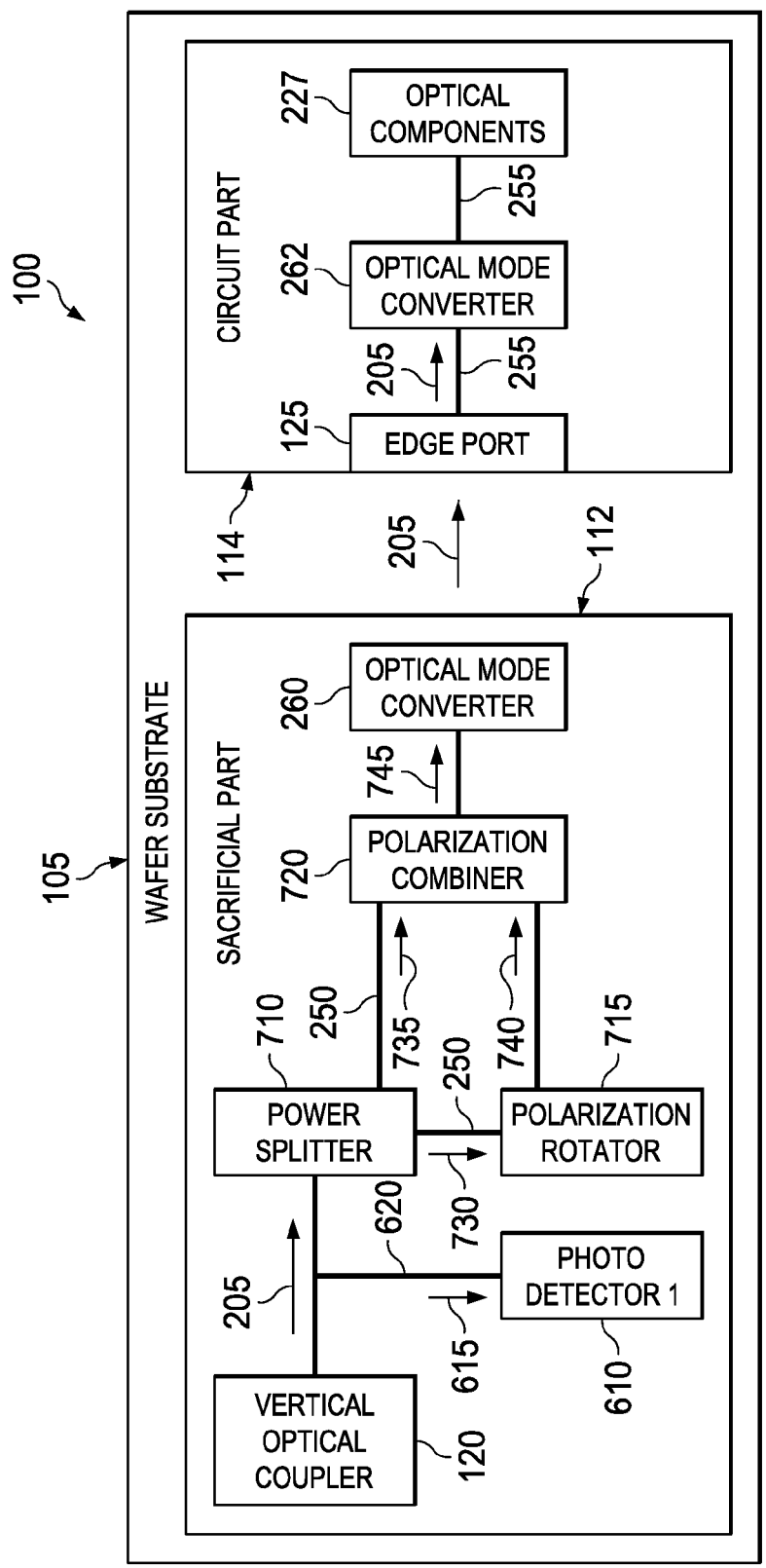
FIG. 7 presents a block diagram of a portion of an alternative example apparatus similar to that depicted in FIG. 3.

As illustrated in FIG. 7, in some embodiments, the sacrificial testing part 112 can further include a optical power splitter 710, a polarization rotator 715, polarization combiner 720, and the optical mode converter 260. The power splitter 710 is configured to receive the redirected test light signal 205 from the vertical optical coupler 120 and send a first portion 730 of the test light signal 205 to the polarization rotator 715 and a second portion 735 of the test light signal 205 to the polarization combiner 720. The polarization rotator 715 is configured to rotate the polarization of the first portion 730 of the test light signal 205 (e.g., having a Transverse Electric, TE, polarization) and send a polarization-rotated form 740 (e.g., rotated to transverse-magnetic, TM, polarization form) of the first portion 730 of the test light signal 205 to the polarization combiner 720. The polarization combiner 720 is configured to send the polarization-rotated form of the first portion 740 and the second portion 735 (e.g., non-rotated TE form) of the test light signal 206 to the optical mode converter 260 as combined test light signal 745. Such embodiments are advantageous in cases where the vertical optical coupler 120 (e.g., a grating coupler) is capable of coupling only one polarization form of light (e.g., a TE form only) but the functionality of optical circuit part 114 should be tested using both TE and TM polarized light form such as provided by the polarization combiner 720.

Figure 8:
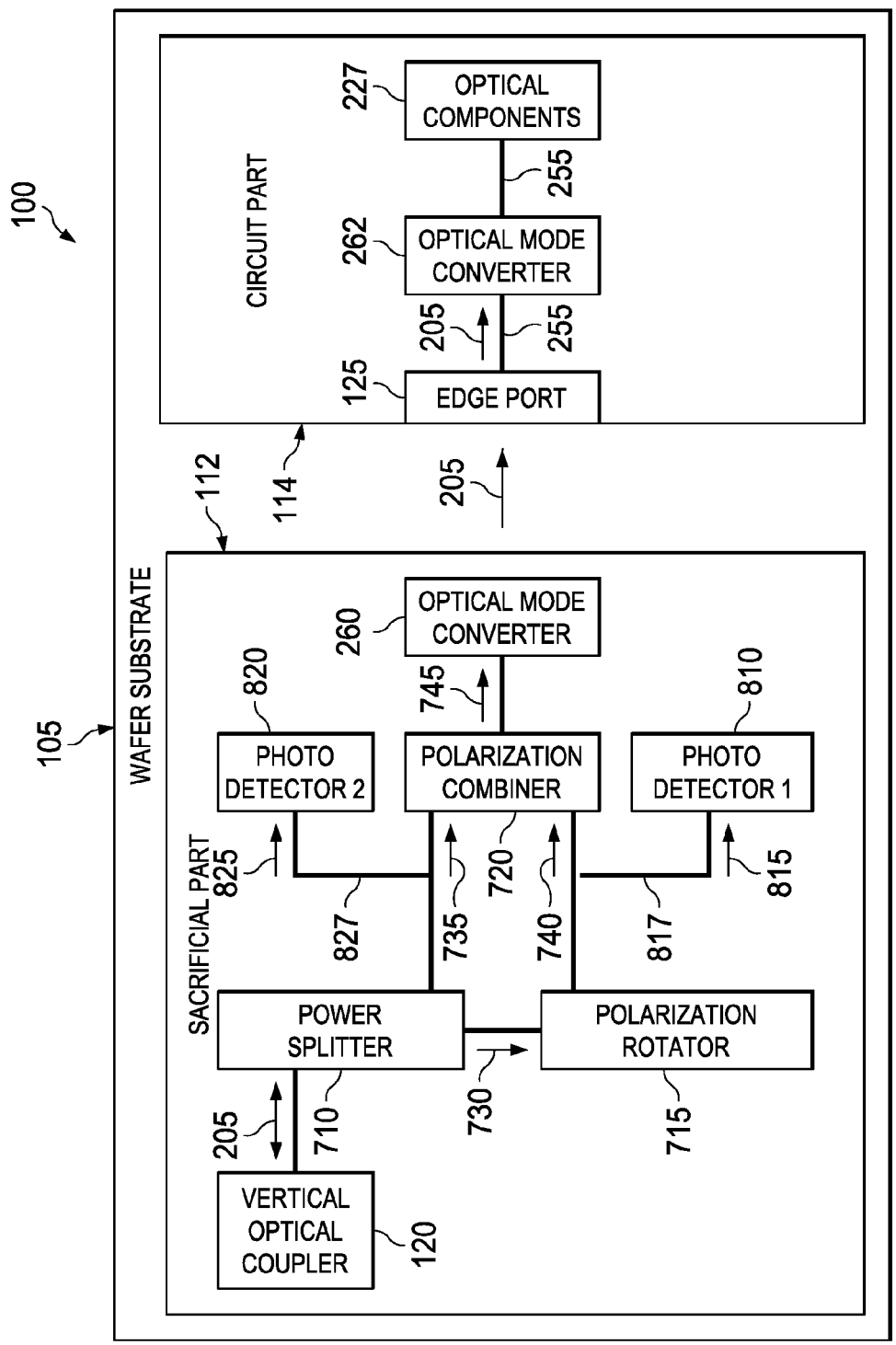
FIG. 8 presents a block diagram of a portion of an alternative example apparatus similar to that depicted in FIG. 3.

Similar to the embodiments discussed in the context of FIG. 6, some embodiments presented in FIG. 7 can also include a photo detector 610 that receives a tapped portion 610 of the test light signal 205 that is not received by power splitter 710. In still other embodiments, such as shown in FIG. 8, the apparatus can include a first photo detector 810 that receives a tapped portion 815 (e.g., via tapping waveguide 817) of the polarization-rotated form 740 of first portion 730 of the test light signal 205 that is not received by the polarization combiner 720 and a second photo detector 820 that receives a tapped portion 825 (e.g., via tapping waveguide 827) of the second portion 735 of the test light signal 205 that is not received by the polarization combiner 720. The first and second photo detectors 810, 820 can be configured to measure the optical power and/or the optical spectrum of the different polarization forms of the test light signal (e.g., the TM polarization-rotated form portion 740 and TE polarization-rotated form portion 735), e.g., to facilitate normalizing differences in the test results obtained from the optical circuit part 114.

Figure 9:
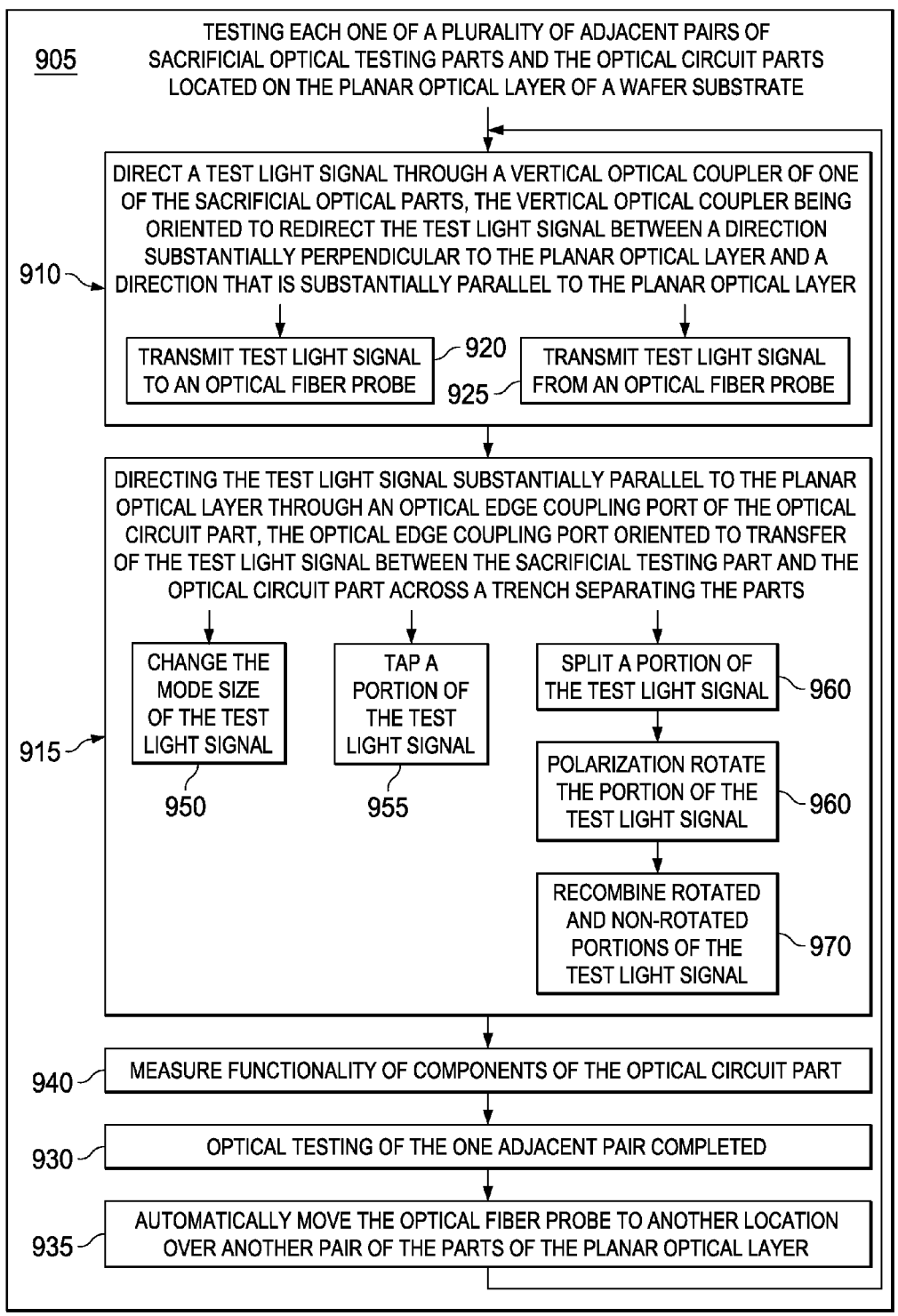
FIG. 9 presents a flow diagram of an example method of using an apparatus of the disclosure, such as any of the example apparatuses described in the context of FIGS. 1A-8.

Another embodiment is a method. FIG. 9 presents a flow diagram of an example method 900, such as a method of using any of the example apparatuses 100 described in the context of FIGS. 1A-8 for wafer level testing. For instance, the method 900 can be or includes a method of testing the functionality of the optical circuit parts 114 of the substrate wafer 105, such as performed in a wafer fabrication foundry where the optical circuit parts 114 were initially formed on the substrate wafer 105, or, in a testing facility to which the substrate wafer 105 has been transferred.

With continuing reference to FIGS. 1A-8 throughout, as illustrated in FIG. 9, the method 900 comprises testing (step 905) each one of a plurality of adjacent pairs 110 of sacrificial optical testing parts 112 and the optical circuit parts 114 located on the planar optical layer 107 a wafer substrate 105.

Testing the pairs 110 (step 905) includes a step 910 of directing a test light signal 205 through a vertical optical coupler 120 of one of the sacrificial optical parts 112, the vertical optical coupler 120 being oriented to redirect the test light signal 205 between a direction 210 substantially non-parallel to the planar optical layer 107 and a direction 215 that is substantially parallel to the planar optical layer 107.

The test light signal 205 can include any one or more of the common optical telecommunication bands, including the Original (e.g., about 1260 to about 1360 nm), Extended (e.g., about 1360 to about 1460 nm), Short (e.g., about 1460 to about 1530 nm), Conventional (e.g., about 1530 to about 1565 nm), Long (from e.g., 1565 to about 1625 nm) or Ultralong (e.g., about 1625 to about 1675) bands. Test light signal 205 can have one more polarization forms (e.g., TE or TM only or a combination of TE and TM polarization forms).

Testing of the pairs 110 (step 905) includes a step 915 of directing the test light signal 205 traveling in the direction 215 substantially parallel to the planar optical layer 107 through an optical edge coupling port 125 of the optical circuit part 114, the optical edge coupling port 125 oriented to transfer of the test light signal 205 between the sacrificial testing part 112 and the optical circuit part 114. The test light signal 205 traveling in the direction 215 substantially parallel to the planar optical layer 107 passes across a trench 130 located in the planar optical layer 107. The trench 130 separates the sacrificial testing part 112 from the optical circuit part 114 for each of the plurality of adjacent pairs 110.

To facilitate rapid testing (step 905) an alignment module 145 of the apparatus 100 can be programmed to facilitate automatic and successive optical testing of each one of the plurality of pairs 110 until all of the optical circuit parts 112 of all of the adjacent pairs 110 have been tested. For instance, in some embodiments, as part of directing the test light signal 205 through the vertical optical coupler 120 (step 910), the test light signal 205 can be transmitted to (step 920), or, from (step 925), an end of an optical fiber probe 140 located over the planar optical layer 107. After the completion of optical testing of the one adjacent pair 110 (step 930), the alignment module 145 of the apparatus 145 automatically moves, in step 935, the optical fiber probe 140 to another location over another pair 110 of the parts 112, 114 of the planar optical layer, and, the test light signal 205 is again directed in step 910 though a different vertical optical coupler of a different one of the sacrificial optical testing parts.

One skilled in the pertinent art would understand how an alignment module 145 could be programmed to automatically shift the location of the optical fiber probe 140 over the planar optical layer 107, or alternatively, shift the location of the wafer substrate 105 under a fixed optical fiber probe 140, so that each one the vertical optical couplers 120 of the sacrificial parts 112 and the adjacent edge coupled optical circuit parts 114 are successively tested. In some embodiments, such as when testing substrate wafers 107 such as illustrated in FIG. 4 or 5, the an alignment module 145 can be programmed to move two optical fiber probes in tandem to transmit (step 920) the optical test signal 205 to a first optical vertical coupler 120 and receive (step 925) an optical output test signal 405 from a second optical vertical coupler 420. One skilled in the pertinent art would understand how to increase the speed of wafer level optical testing, the alignment module 145 could be programmed to automatically shift as part of step 935 the locations of the several optical fiber probes 140 (e.g., several individual or tandem pairs optical fiber test probes) over the planar optical layer 107 such that each of the optical fiber probes are simultaneously aligned with different ones of the vertical optical couplers 120.

As illustrated in FIG. 9, part of testing the pairs (step 905) can include measuring (step 940) the functionality of components 227 of the optical circuit part 114. For instance, measuring the functionality (step 940) can include measuring of the optical insertion loss and/or the optical output spectrum from the optical circuit part 114. For instance, measuring the functionality (step 940) can include measuring the optical output (e.g., optical output 405) of the optical circuit part 114 in response to commands introduced from optical test signal 205 and/or from radio frequency or electrical signal from probes located over the optical circuit part 114. For instance, measuring the functionality (step 940) can include measuring electrical output from the circuit in response to command sent as part of the test light signal response to commands introduced from optical test signal 205.

As part of directing the test light signal 205 in the direction 215 substantially parallel to the planar optical layer 107, step 915 can include further modification of the test light signal 205. For instance, as discussed in the context of FIGS. 2A-8, the mode size of the test light signal 205 can be changed, e.g., increased (step 950) by passing the test light signal 205 through an optical mode converter 260 of the sacrificial testing part 112 and/or through an optical mode converter 262 of the optical circuit part 114. For instance, as discussed in the context of FIGS. 6-8, a portion of the test light signal 205 can be tapped (step 955) to one or more photo detectors 610, 810, 820. For instance as discussed in the context of FIGS. 7-8, the test light signal 205 can be split (step 960, e.g., via power splitter 710) and a portion 730 of the test light signal 205 can be passed through a polarization rotator 715 to form a polarization rotated optical test signal 740 (step 965, e.g., via polarization rotator 715) and recombined (step 970, e.g., via polarization rotator 720) with a non-polarization rotated portion 735 of the optical test signal 205.

Figure 10:
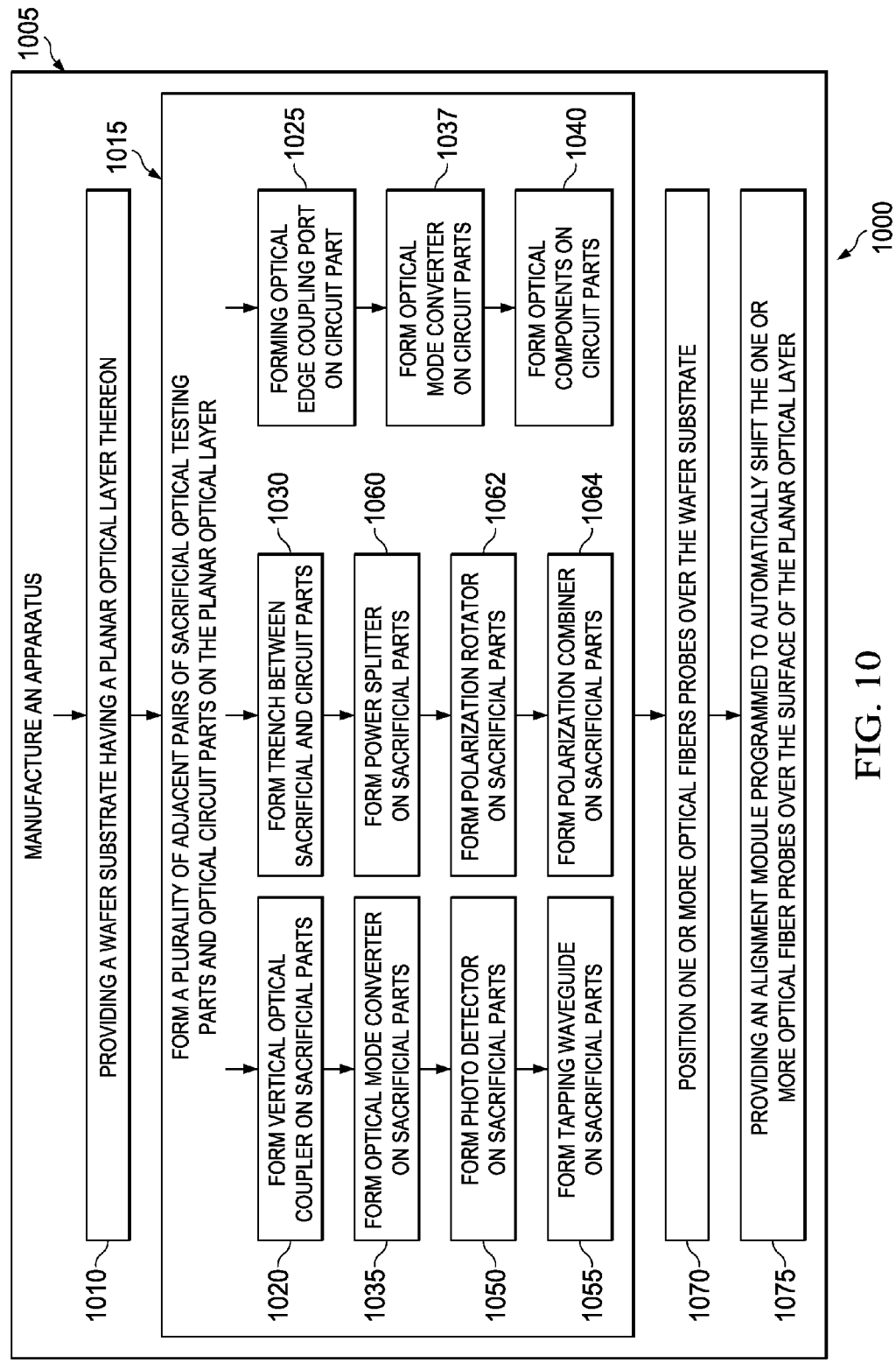
FIG. 10 presents a flow diagram of an example method of manufacturing an apparatus of the disclosure, such as any of the example apparatuses described in the context of FIGS. 1A-8.

Another embodiment is another method. FIG. 10 presents a flow diagram of an example method 1000 that comprises manufacturing an apparatus of the disclosure, such as any of the example apparatuses 100 described in the context of FIGS. 1A-9.

With continuing reference to FIGS. 2A-8 throughout, manufacturing an apparatus (step 1005) includes a step 1010 of providing a wafer substrate 105 having a planar optical layer thereon 107. One skilled in the pertinent arts would be familiar procedures to form wafer handles layers 230 and form optical layers 107, 225 that are suitable for forming optical devices thereon as part of providing the wafer substrate in step 1010.

Manufacturing an apparatus (step 1005) also includes forming (step 1015) a plurality of adjacent pairs 110 of sacrificial optical testing parts 112 and optical circuit parts 114 on the planar optical layer 107. Forming the adjacent pairs 110 (step 1015) includes forming (step 1020) a vertical optical coupler 120 on each of the sacrificial testing parts 112. The vertical optical coupler 120 is formed so as to be oriented to redirect a test light signal 205 between a direction 210 substantially non-parallel to the planar optical layer 107 and a direction 215 that is parallel to the planar optical layer 107. Forming the adjacent pairs 110 (step 1015) includes forming (step 1025) an optical edge coupling port 125 on each of optical circuit parts 114. The optical edge coupling port 125 is formed so as to be oriented to transfer the test light signal 205 through the optical edge coupling port 125 and between the sacrificial testing part 112 and the optical circuit part 114.

Manufacturing an apparatus (step 1005) also includes forming (step 1030) a trench 130 in the planar optical layer 107. The trench 130 is formed so as to separate the sacrificial testing part 112 from the optical circuit part 114 for each of the plurality of adjacent pairs 110 such that the test light signal 205 passes across the trench 130 between the sacrificial testing part 112 and the optical circuit part 114.

One skilled in the pertinent art would be familiar with optical device fabrication procedures, including conventional photo lithographic patterning, material deposition, dopant implantation and etching procedures to form the sacrificial optical testing parts 112 and optical circuit parts 114 and their components, including the vertical optical coupler 120 and the optical edge coupling port 125, and other optional components described herein, as well as the trench 130.

For instance, forming the vertical optical coupler 125 in step 1020 can include patterning the planar optical layer 107 to form an optical grating or a turning mirror in the planar optical layer 107. For instance, forming the trench 130 in step 1030 can include patterning the planar optical layer to form an extension portion 150 of the sacrificial part 150 that partially extends across the trench 130 towards the optical edge coupler 125 to provide the gap distance discussed in the context of FIG. 1B.

Similar fabrication procedures can be applied to form optical mode converters 250, 255, 425, 430 on the sacrificial testing part 112 and/or the optical circuit testing part 114 (steps 1035, 1037), and the optical components 227 of the optical circuit part 114 (step 1040). Similar procedures can be applied to form a photo detector 610 (step 1050) and tapping waveguide 620 (step 1055) on each of the sacrificial testing parts 112 such that the photo detector 610 is configured to receive a tapped portion 615 of the test light signal 205 that is not received by the optical circuit part 112. Similar fabrication procedures can be applied to form a power splitter 720 (step 1060), a polarization rotator 715 (step 1062), polarization combiner 720 (step 1064) on the sacrificial testing part 112.

In some embodiments, manufacturing the apparatus 100 (step 1005) also includes a step of positioning (step 1070) one or more optical fibers probes 140 over one or more of the optical vertical couplers 120 on the wafer substrate 105 and providing (step 1075) an alignment module 145 programmed to automatically shift the one or more optical fiber probe 140 over the planar optical layer 107, e.g., over the surface 132 from one of the adjacent pairs 110 to another one of the adjacent pairs 110 as part of a wafer level testing procedure, such as described herein in the context of FIG. 9.

Although the present disclosure has been described in detail, those skilled in the art should understand that they can make various changes, substitutions and alterations herein without departing from the scope of the invention.

What is claimed is:

1. An apparatus, comprising:
   a wafer substrate having a planar optical layer thereon;
   a plurality of adjacent pairs of sacrificial optical testing parts and optical circuit parts located on the optical layer, wherein:
   the sacrificial testing part includes a vertical optical coupler that is oriented to redirect a test light signal between a direction substantially non-parallel to the planar optical layer and a direction that is substantially parallel to the planar optical layer, and
   the optical circuit part includes an optical edge coupling port oriented to permit transfer of the test light signal through the optical edge coupling port and between the sacrificial testing part and the optical circuit part; and
   a trench located in the planar optical layer, the trench separating the sacrificial testing part from the optical circuit part for each of the plurality of adjacent pairs such that the test light signal passes across the trench between the sacrificial testing part and the optical circuit part.

2. The apparatus of claim 1, wherein the vertical optical coupler includes a mirror or a grating.

3. The apparatus of claim 1, wherein the vertical optical coupler receives the test light signal transmitted from an optical testing fiber located above the planar optical layer, and the test light signal is redirected from the vertical optical coupler to a waveguide of the sacrificial part, across the trench and to the optical edge coupling port of the circuit part.

4. The apparatus of claim 1, wherein the optical circuit part includes a laser configured to emit the test light signal to a waveguide of the optical circuit part, wherein the test light signal passes through the optical edge coupling port, across the trench to an optical waveguide of the sacrificial part to the vertical optical coupler and is redirected to an optical test fiber located above the planar optical layer to receive the test light signal.

5. The apparatus of claim 1, wherein the optical circuit part further includes a second optical edge coupling port, wherein the test light signal is directed out of the circuit part.

6. The apparatus of claim 1, wherein an extension portion of the sacrificial part extends part way across the trench towards the optical edge coupler, wherein a gap distance between an end of the extension portion and the optical edge coupler is at least about 50 percent less than a remaining portion of trench width that does not include the extension portion.

7. The apparatus of claim 1, wherein the sacrificial testing part includes an optical mode converter through which the test light signal passes through before passing across the trench to the optical circuit part.

8. The apparatus of claim 1, wherein the optical circuit part includes an optical mode converter through which the test light signal passes before passing to circuit elements of the optical circuit part.

9. The apparatus of claim 1, wherein the optical edge coupling port of the optical circuit part is configured as one of an input port or an output port.

10. The apparatus of claim 1, wherein the sacrificial testing part includes a photo detector that receives a tapped portion of the test light signal that is not received by the optical circuit part.

11. The apparatus of claim 1, wherein the sacrificial testing part includes a power splitter, a polarization rotator, polarization combiner, and an optical mode converter, wherein:
the power splitter is configured to receive the redirected test light signal from the vertical optical coupler and send a first portion of the test light signal to the polarization rotator and a second portion of the redirected test light signal to the polarization combiner,
the polarization rotator is configured to rotate the polarization of the first portion of the test light signal and send a polarization-rotated form of the first portion of the test light signal to the polarization combiner, and
the polarization combiner is configured to send the polarization-rotated form of the first portion of the test light signal and the second portion of the test light signal to the optical mode converter.

12. The apparatus of claim 11, wherein the sacrificial testing part includes a first photo detector that receives a tapped portion of the first polarization-rotated form of first portion of the test light signal that is not received by the polarization combiner, and, a second photo detector that receives a tapped portion of the second portion of the test light signal that is not received by the polarization combiner.

13. A method, comprising:
wafer-level testing each one of a plurality of adjacent pairs of sacrificial optical testing parts and the optical circuit parts located on the planar optical layer of a wafer substrate, including:
directing a test light signal through a vertical optical coupler of one of the sacrificial optical parts, the vertical optical coupler being oriented to redirect the test light signal between a direction substantially non-parallel to the planar optical layer and a direction that is substantially parallel to the planar optical layer;
directing the test light signal traveling in the direction substantially parallel to the planar optical layer through an optical edge coupling port of the optical circuit part, the optical circuit part oriented to transfer of the test light signal between the sacrificial testing part and the optical circuit part; and wherein
the test light signal traveling in the direction substantially parallel to the planar optical layer passes a across a trench located in the planar optical layer, the trench separating the sacrificial testing part from the optical circuit part for each of the plurality of adjacent pairs.

14. The method of claim 13, wherein the test light signal is transmitted to or from an end of an optical fiber probe located over the planar optical layer and the optical fiber probe is configured to be automatically and successively aligned with the vertical optical coupler of each one of the sacrificial parts.

15. The method of claim 13, further including monitoring the redirected test light signal by passing a tapped portion of the redirected test light signal to a photo detector of the sacrificial testing part.

16. A method, comprising:
manufacturing an apparatus including:
providing a wafer substrate having a planar optical layer thereon;
forming a plurality of adjacent pairs of sacrificial optical testing parts and optical circuit parts on the planar optical layer, including:
forming a vertical optical coupler of each of the sacrificial testing parts, the vertical optical coupler oriented to redirect a test light signal between a direction substantially non-parallel to the planar optical layer and a direction that is parallel to the planar optical layer, and
forming an optical edge coupling port on each of optical circuits, the optical edge coupling port oriented to permit transfer of the test light signal through the optical edge coupling port and between the sacrificial testing part and the optical circuit part; and
forming a trench in the wafer substrate, the trench separating the sacrificial testing part from the optical circuit part for each of the plurality of adjacent pairs such that the test light signal passes across the trench between the sacrificial testing and the optical circuit part.

17. The method of claim 16, wherein forming the vertical optical coupler includes patterning the planar optical layer to form an opting grating or a turning mirror in the planar optical layer.

18. The method of claim 16, wherein forming the trench includes patterning the planar optical layer to form an extension portion of the sacrificial part that partially extends across the trench towards the optical edge coupler, wherein a gap distance between an end of the extension portion and the optical edge coupler is at least about 50 percent less than a remaining portion of trench width that does not include the extension portion.

19. The method of claim 16, further including forming a photo detector on each of the sacrificial testing parts, the photo detector configured to receive a tapped portion of the test light signal that is not received by the optical circuit part.

20. The method of claim 16, further including positioning one or more optical fiber probes over one or more of the optical vertical couplers of the planar optical layer and providing an alignment module programmed to automatically shift the one or more optical fiber probe over the planar optical layer.

21. An apparatus, comprising:
an optical circuit part formed by the process of:
forming, on a wafer substrate having a planar optical layer located thereon, a plurality of adjacent pairs located on the optical layer, each pair including a sacrificial optical testing part and an instance of the optical circuit part, wherein:
the sacrificial testing part includes a vertical optical coupler that is oriented to redirect a test light signal between a direction substantially non-parallel to the planar optical layer and a direction that is substantially parallel to the planar optical layer, and
the optical circuit part includes an optical edge coupling port oriented to permit transfer of the test light signal through the optical edge coupling port and between the sacrificial testing part and the optical circuit part; and
forming a trench located in the planar optical layer, the trench separating the sacrificial testing part from the optical circuit part for each of the plurality of adjacent pairs such that the test light signal is able to pass across the trench between the sacrificial testing part and the optical circuit part.

22. The apparatus of claim 21, wherein the optical circuit part includes a laser configured to emit the test light signal to a waveguide of the optical circuit part, wherein the test light signal passes through the optical edge coupling port, across the trench to an optical waveguide of the sacrificial part to the vertical optical coupler and is redirected to an optical test fiber located above the planar optical layer to receive the test light signal.

23. The apparatus of claim 21, wherein the optical circuit part further includes a second optical edge coupling port, wherein the test light signal is directed out of the circuit part.

24. The apparatus of claim 21, wherein the optical circuit part includes an optical mode converter through which the test light signal passes before passing to circuit elements of the optical circuit part.

25. The apparatus of claim 21, wherein the optical edge coupling port of the optical circuit part is configured as one of an input port or an output port.

* * * * *